United States Patent
Andricacos et al.

[19]

[11] Patent Number: 5,998,250
[45] Date of Patent: Dec. 7, 1999

[54] COMPOUND ELECTRODE STACK CAPACITOR

[75] Inventors: Panayotis Constantinou Andricacos, Croton-on-Hudson; David Edward Kotecki, Hopewell Junction; Katherine Lynn Saenger, Ossining, all of N.Y.

[73] Assignee: International Business Machines Corporation, Armonk, N.Y.

[21] Appl. No.: 09/062,031

[22] Filed: Apr. 17, 1998

Related U.S. Application Data

[62] Division of application No. 08/636,457, Apr. 23, 1996, Pat. No. 5,825,609.

[51] Int. Cl.[6] ............................................. H01L 21/8242
[52] U.S. Cl. ............................... 438/240; 438/3; 438/254
[58] Field of Search ............................... 438/3, 238–240, 438/253–256, 381, 396–399

[56] References Cited

U.S. PATENT DOCUMENTS

| | | | |
|---|---|---|---|
| 5,142,639 | 8/1992 | Kohyama et al. | 357/23.6 |
| 5,187,549 | 2/1993 | Fuji | 257/306 |
| 5,191,510 | 3/1993 | Huffman | 361/313 |
| 5,262,662 | 11/1993 | Gonzalez et al. | 257/307 |
| 5,270,241 | 12/1993 | Dennison et al. | 437/52 |
| 5,418,388 | 5/1995 | Okudaira et al. | 257/295 |
| 5,489,548 | 2/1996 | Nishioka et al. | 437/60 |
| 5,573,979 | 11/1996 | Tsu et al. | 437/195 |
| 5,581,436 | 12/1996 | Summerfelt et al. | 361/321.1 |
| 5,605,858 | 2/1997 | Nishioka et al. | 437/60 |

FOREIGN PATENT DOCUMENTS

| | | |
|---|---|---|
| 0 698 918 A1 | 2/1996 | European Pat. Off. . |
| 0 726 600 A2 | 8/1996 | European Pat. Off. . |

OTHER PUBLICATIONS

Kaga, et al. "Crown–Shaped Stacked–Capacitor Cell for 1.5–V Operation 64–Mb DRAM's" IEEE Transactions on Electron Device 38(2): 25–260 (1991).

*Primary Examiner*—Joni Chang
*Attorney, Agent, or Firm*—Scully, Scott, Murphy & Presser; Robert M. Trepp, Esq.

[57] ABSTRACT

This invention is directed to a semiconductor memory device including a storage element comprising a ferroelectric material or a capacitor dielectric material between a top (plate) electrode and a bottom (stack) electrode. In particular, the invention pertains to the design and fabrication of the stack electrode, which is described as compound because it is comprised of two or more materials which are either patterned separately (with at least one material being deposited and patterned prior to the deposition of the others), or arranged so that each of the component materials significantly contributes to the area over which the ferroelectric or capacitor dielectric is initially deposited. These compound stack electrodes may offer ease in processing, more economical use of noble metal materials, and potentially increased mechanical stability (e.g., resistance to hillocking) relative to solid, single-material electrodes of the same dimensions.

6 Claims, 6 Drawing Sheets

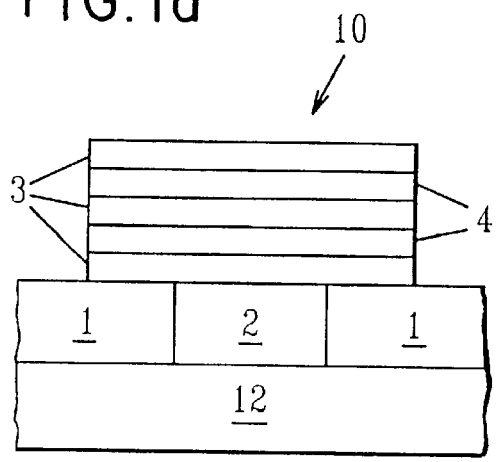
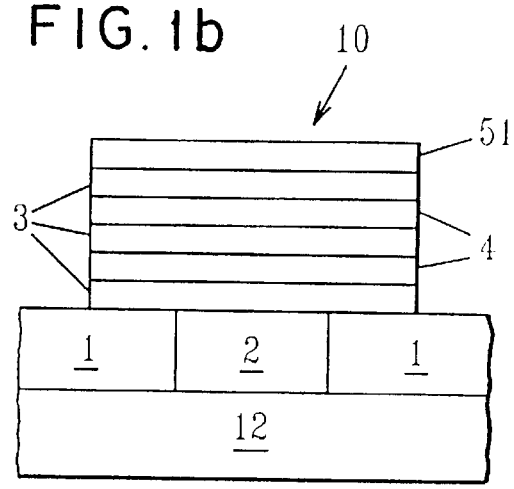
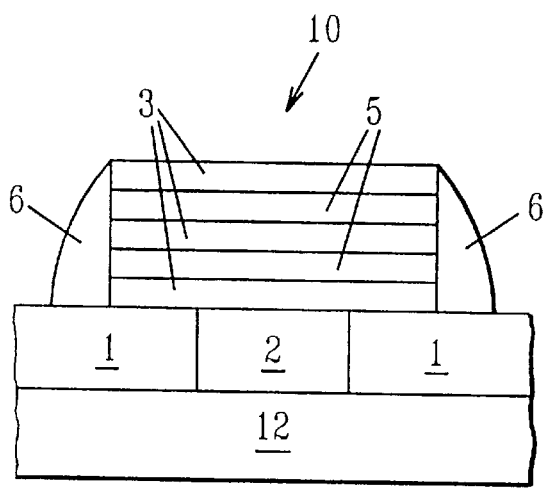
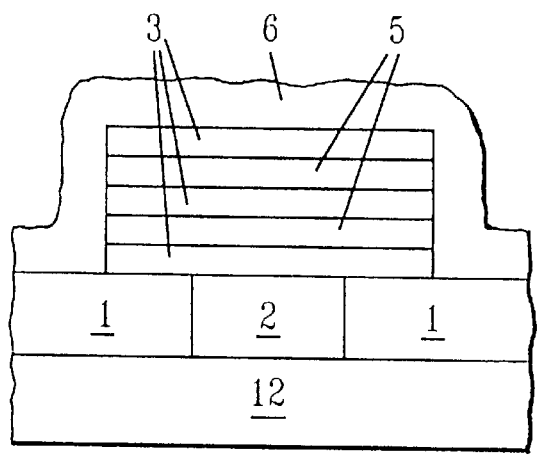
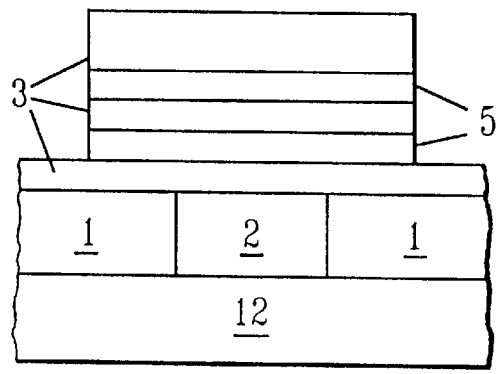

COMPOUND ELECTRODE STACK CAPACITOR

CROSS REFERENCE TO RELATED APPLICATION

The present application is a divisional of application Ser. No. 08/636,457 filed Apr. 23, 1996, U.S. Pat. No. 5,825,609.

BACKGROUND OF THE INVENTION

1. Field of the Invention

This invention is directed to stack capacitors for DRAM and FRAM and, more particularly, to a compound electrode stack capacitor, as well as simple processes for fabricating the new stack capacitor electrodes. The electrode structures are made from materials suitable for use with high-dielectric constant materials (e.g., Pt) and are compound because the component parts of the electrode structures are either deposited in separate steps or formed from more than one layer of material.

2. Description of the Prior Art

The incorporation of high dielectric constant materials into small geometry capacitors suitable for Gigabit scale DRAM introduces fabrication challenges relating to topography, electrode material patterning, reaction of high-epsilon materials with Si contact and ultimate density/scalability. Similar challenges pertain to the fabrication of ferroelectric memory cells for ferroelectric RAM (FRAM) and other nonvolatile RAM (NVRAM). Most fabrication schemes for making the electrodes for nonplanar memory cells (a category of devices including both capacitors or "dielectric memory cells" and ferroelectric memory cells) rely on either chemical-mechanical-polishing (CMP) and reactive-ion-etching (RIE). However, these processes to pattern electrode materials such as Pt and other noble metals are still under development; while some processes may eventually be useable in one form or another, there is no guarantee that completely suitable ones will be found.

Suitable electrode materials and fabrication/patterning processes must be developed if high-epsilon dielectric and ferroelectric materials are to be integrated into microelectronic devices. Noble metals and their alloys are often preferred as electrodes for these applications, in part because of their resistance to oxidation during dielectric deposition. However, these materials can be difficult to pattern.

It is an object of the present invention to provide an electrode structure that can be fabricated without CMP or RIE-patterning of a thick electrode layer.

It is another object of the present invention to provide a tall stack electrode having noble metal surfaces and a method of fabrication which does not require CMP or a thick noble metal etch.

It is yet another object of the present invention to provide a noble metal cup electrode whose method of fabrication does not require CMP or fill/etchback.

SUMMARY OF THE INVENTION

The present invention is directed to a semiconductor memory device including a storage element comprising a ferroelectric material or a capacitor dielectric material between a top (plate) electrode and a bottom (stack) electrode. In particular, the invention pertains to the structure and fabrication method of a compound stack electrode, which is described as compound because it is comprised of two or more materials which are either patterned separately (with at least one material being deposited and patterned prior to the deposition of the others), or arranged so that each of the component materials significantly contributes to the area over which the ferroelectric or capacitor dielectric is initially deposited. Stack electrodes having these compound structures offer ease in processing, more economical use of noble metal materials, and potentially increased mechanical stability (e.g., resistance to hillocking) relative to solid, single-material electrodes.

This invention defines a simple fabrication method for several new designs of compound stack capacitor electrodes. The electrodes structures are made from materials suitable for use with high-dielectric constant materials (e.g., noble metals such as Pt). Several embodiments contain cavities which are filled with one or more materials ("fillings") which may or may not remain in the final structure after processing.

All electrode structures are formed on a substrate containing bottom electrode contact vias imbedded in a planar dielectric, said contact vias filled with one or more conductive materials (any of which might also serve as a diffusion barrier to oxygen) to make a conductive plug.

Various cup (or container) electrodes with various degrees of filling are disclosed. The electrode may contain the same conducting material for the bottom and sides, or different conducting materials. The side electrode material can be Pt, Ir, Ru, or Pd. The filling material can be conducting or non-conducting. One embodiment is a capped and completely filled container electrode, in which a conducting electrode cap material may be the same or different from the side and bottom electrode materials forming the container. Again, the filling material may be conducting or non-conducting. Another embodiment is disclosed in which the bottom layer of electrode material is omitted. For this structure, the filling material must be conducting in order to keep the top and sides of the electrode stack electrically connected to the contact via.

A principal advantage of this invention is that the disclosed compound electrode structures provide the functional equivalent of a tall, solid noble metal electrode without the difficulties associated with patterning a thick noble metal layer (whose thickness would have to approximate the desired electrode height). In particular, the disclosed noble metal coated electrodes can be fabricated without using CMP or the etch of a thick Pt layer. The fill material infrastructure of the electrode may be made out of a material that is easily patterned but which does not necessarily have all the properties required for the electrode material. Secondary advantages of the structure are (1) the possible use of the fill material to reduce electrode hillocking, due to the thin film electrode coatings rather than solid electrodes, (2) relatively economical use of noble metals (only depositing thin films of noble metal material, not depositing and etching thick films), (3) multiple material electrodes, (4) possible reduction in oxygen diffusion through a compound electrode as compared to a solid electrode.

Previous "empty cup" container electrodes have been made from doped-polysilicon by CMP (1) or with fill/etchback processes (2). However, these processes are unlikely to work for the noble metal electrode materials desired in high-epsilon dielectric-containing capacitors. The disclosed electrode fabrication process would work for most electrode materials of interest (such as Pt, Ir, Ru, and Pd) and additionally produces structures which (because of the extra seam between the bottom and sides of the electrode) are distinguishable from those made with the more conventional processes.

In another embodiment, the compound stack electrode is formed of alternating layers of conducting material, such as noble metals, e.g., Pt and Pd. The number and thickness of layers may be varied. The electrode layers can be chosen to optimize mechanical stability to minimize structural stresses and potential damage due to thermal expansion mismatches and hillocks. In addition, the electrode layers need not be all conducting if a conductive sidewall spacer is formed on the multilayer stack electrode.

The principal advantage of the present invention is that it provides an extremely efficient and cost effective way to fabricate stack electrodes suitable for Gigabit scale DRAM and FRAM.

BRIEF DESCRIPTION OF THE DRAWINGS

FIG. 1a is a cross-sectional view of one embodiment of a multilayer stack electrode structure of the present invention.

FIG. 1b is a cross-sectional view of the same embodiment with an additional dielectric layer cap.

FIG. 2 is a cross-sectional view of another embodiment of the multilayer stack electrode structure of the present invention, having a conductive sidewall.

FIG. 3 is a cross-sectional view of an intermediate step in one method of forming the structure of FIG. 2.

FIG. 4 is a cross-sectional view of an intermediate step in another method of forming the structure of FIG. 1a.

FIG. 6b is a cross-sectional view of a self-aligned variation of the structure of FIG. 6a.

DETAILED DESCRIPTION OF THE INVENTION

Figure 5:
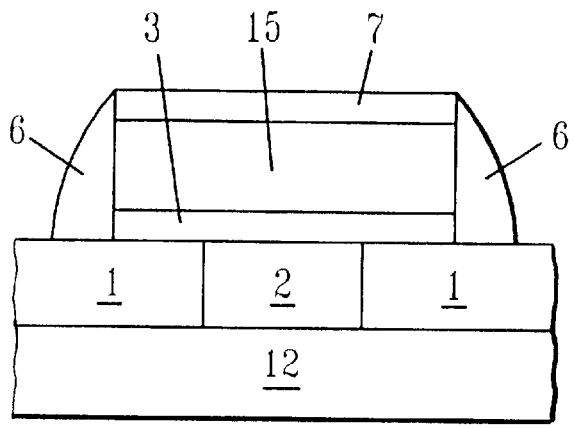
FIG. 5 is a cross-sectional view of another embodiment of the multilayer stack electrode of the present invention having a single middle layer.

This invention provides designs for compound stack electrodes which offer ease in processing, more economical use of noble metal materials, and increased mechanical stability relative to solid, single-material electrodes of the same dimensions.

Turning now to the drawings, several embodiments of the structure and method of fabrication of the present invention are shown, in which like numerals are used to reference like elements.

One preferred embodiment of the compound stack electrode is shown in FIG. 1a. The electrode 10 is formed on a substrate 12 having a dielectric layer 1 containing an embedded conductive plug 2. Electrode 10 consists of alternating layers of noble metals, e.g., Pt 3 and Pd 4, deposited over an optional adhesion layer (not shown). The number and thickness of layers may be varied; in FIG. 1a there are three Pt layers and two Pd layers, each having a thickness of ≅1000 Å. This layered structure will have increased resistance to hillocking relative to a solid Pt electrode of the same dimensions. The structure of FIG. 1 can be made by depositing the layers 3 and 4 as blanket films, and then etching the stack to define a stack electrode structure. While the embodiment of FIG. 1a incorporates two noble metals, the layers need not all be noble metals if the electrode structure is additionally coated with a noble metal as shown in FIG. 2.

FIG. 1b shows the structure of FIG. 1a with an additonal dielectric cap layer 51. This added layer (which might also have a thickness of about 1000 Å) improves the resistance of the layered electrode to hillocking, especially when the conductive electrode layers are thick and few in number. However, the structure of FIG. 1b has the disadvantage that it reduces the stack electrode area on which the ferroelectric or high-epsilon dielectric may be deposited.

FIG. 2 shows the first of several electrode embodiments incorporating a conductive sidewall coating on the electrode stack. The electrode structure is similar to that of FIG. 1a, but modified by (i) the substitution of conductive or non-conductive layer 5 for conductive layer 4, and (ii) the addition of a conductive sidewall coating 6. Sidewall coating 6 and layers 3 may be of the same material (e.g., Pt); layer 5 can be $SiO_2$. This structure provides the mechanical stability of a layered structure, while keeping Pt (or whatever other material might be desired) on all exposed electrode surfaces. Coating 6 may be formed by conformably depositing a layer of conductive material 6 (as shown in FIG. 3) and then anisotropically etching it to form the structure of FIG. 2. Alternatively, one might form the structure of FIG. 2 (with a conductive sidewall coating of material 3) by starting with the structure of FIG. 4, and anisotropically etching the exposed portions of layer 3 in such a manner as to deposit a conductive sidewall coating on the stack electrode with redeposits of sputtered material 3.

FIG. 5 shows a structure similar to that of FIG. 2, except that there is only a single layer 15 between the conductive bottom layer 3 and top layer 7 of the electrode stack. Top layer 7 may be conductive or insulating, although an insulating layer will reduce the stack electrode area on which the ferroelectric or high-epsilon dielectric may be deposited. As in the structure of FIG. 2, the middle layer 15 may be a noble metal, a non-noble metal, some other conductive material, or an electrical insulator. Note that conductive layer 3 may be the same or different from material 6, and/or the same as layer 7 if layer 7 is conductive. This embodiment has the advantage that the height of the electrode is largely determined by the thickness of layer 15, which can be made from a material that is easy to etch. A Pt-coated electrode could thus be much higher than what would be possible or practical with solid Pt.

Figure 6A:
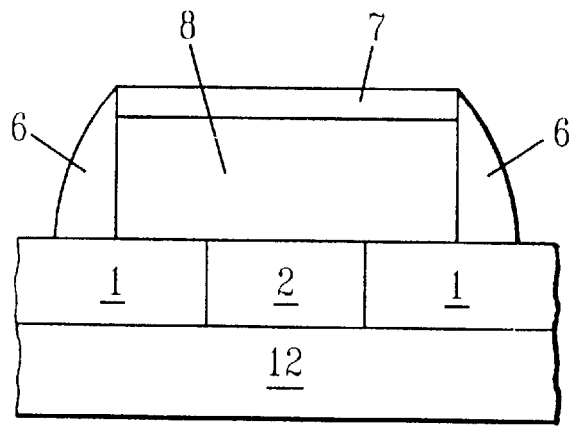
FIG. 6a is a cross-sectional view of another embodiment of the multilayer stack electrode of the present invention having a conductive thick bottom layer.

FIG. 6a shows a structure similar to that of FIG. 5, except that the bottom layer 8 is a thick layer that must be conductive. It is preferred that layer 8 be an oxidation-resistant material which acts as a diffusion barrier to both oxygen and plug material. As with the previous embodiments, the structure of FIG. 6a might be made by depositing the layers 8 and 7 as blanket films, etching the stack to define the stack electrode infrastructure (i.e., layers 7 and 8 after patterning), and then forming a sidewall of material 6 by conformal deposition and self-aligned anisotropic etching. Relative to the embodiment of FIG. 5, this embodiment has the advantage of fewer stack layers, but the disadvantage of more restrictive requirements on the properties of layer material 8.

Figure 6B:
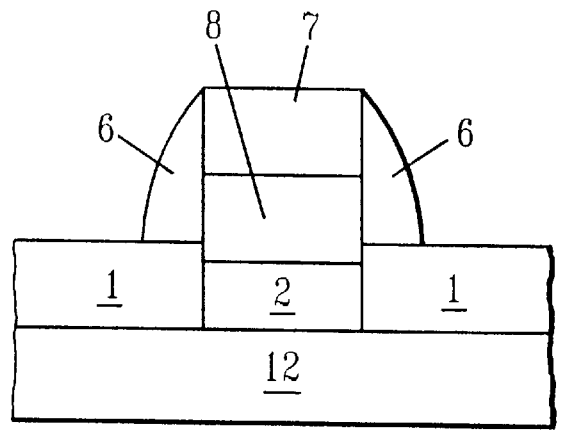

A self-aligned version of the FIG. 6a structure is shown in FIG. 6b. In contrast to the FIG. 6a structure, the stack electrode infrastructure in the FIG. 6b structure is partially embedded in dielectric 1, and has the same lateral dimensions as the top portion of the plug. While the plug in FIG. 6b has the same diameter throughout its length, the structure could also be built with different diameters for the top and bottom portions of the plug (for example, a smaller diameter bottom portion and a somewhat larger oval top portion,. With either plug geometry, the material of conductive layer 8 may be the same or different from that of conductive plug 2. The structure of FIG. 6b (for an embodiment in which layers 7 and 8 are from the same material as conductive plug 2) might be made by etching a via hole in a layer of dielectric 1 having a thickness equal to the combined thicknesses of layers 2, 7 and 8, filling said via hole with the conductive plug material, recessing dielectric 1 to expose those portions of the plug (equivalent to layer 7 and part of layer 8) that will become the stack electrode infrastructure, and then forming a sidewall of material 6 by conformal deposition and self-aligned anisotropic etching. Relative to the embodiment of FIG. 6a, this embodiment has the advantages that the stack electrode is more compact and that the stack electrode is self-aligned with the plug.

Figure 7:
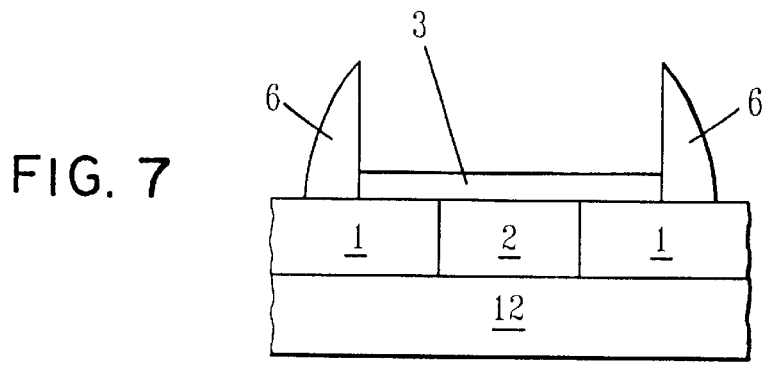
FIGS. 7–9 are cross-sectional views of three embodiments of a multilayer cup-shaped stack electrode of the present invention.
Figure 8:
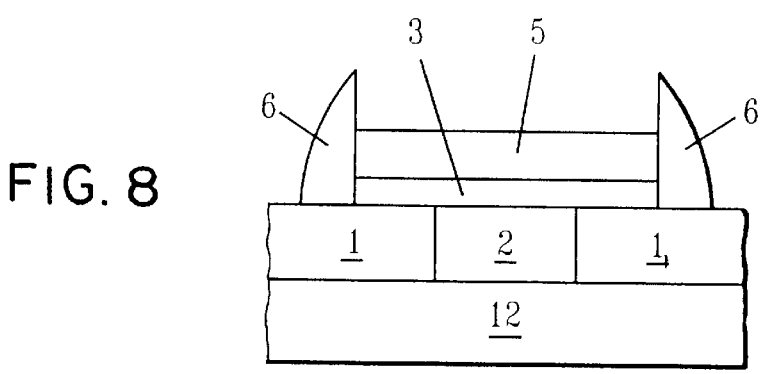
Figure 9:
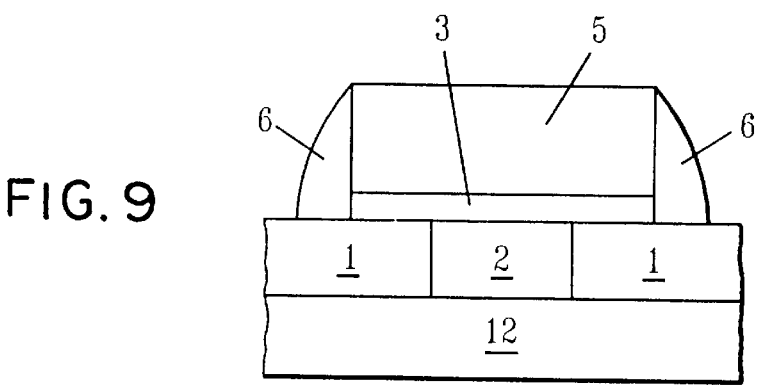

The compound electrode embodiments of FIGS. 7–9 are cup-shaped. All have a horizontal conductive base layer 3 and substantially vertical and free-standing conductive sides 6. The embodiments differ in the degree to which the cup structure is filled or empty. FIG. 7 shows an empty cup-shaped electrode; FIG. 8 shows a cup-shaped electrode partially filled with material 5; FIG. 9 shows a cup-shaped electrode completely filled with material 5.

Figure 10:
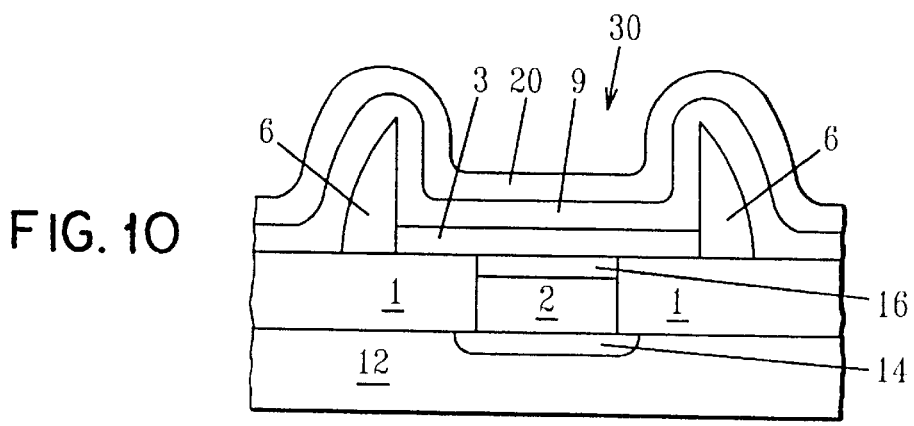
FIG. 10 is a cross-sectional view of a capacitor having the stack electrode of the present invention.

FIG. 10 shows the empty cup-shaped electrode of FIG. 7 incorporated into a capacitor 30 containing capacitor dielectric 9 and top (plate) electrode 20. A contact region 14 is also provided in substrate 12. A barrier layer 16 may optionally be provided. Each of the embodiments of stack electrodes shown in FIGS. 1–9 may be used in the formation of a capacitor or other memory cell electrical device by application of the appropriate additional layers to complete a device as shown in FIG. 10 for a capacitor. It can be seen that the capacitor of FIG. 10 has an area advantage over a capacitor formed with the electrode embodiments of FIGS. 5 and 6 because in FIG. 10 the capacitor dielectric is coated onto both the inside and outside surfaces of the cup electrode.

Figure 11A:
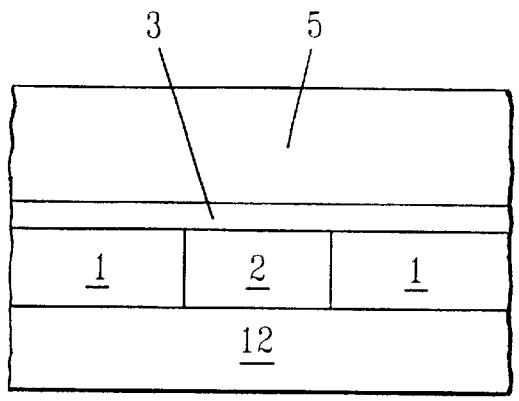
FIGS. 11a–11d are cross-sectional views of several steps in a method of fabrication of the cup electrodes of FIGS. 7–9.
Figure 11B:
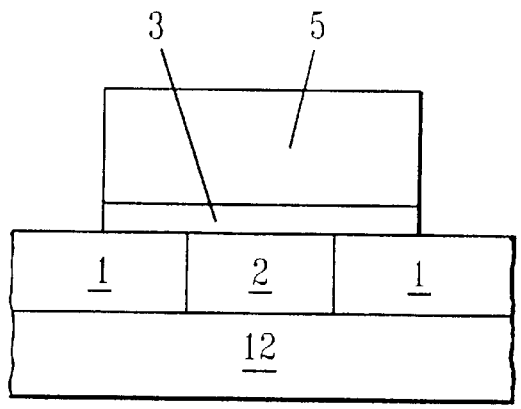
Figure 11C:
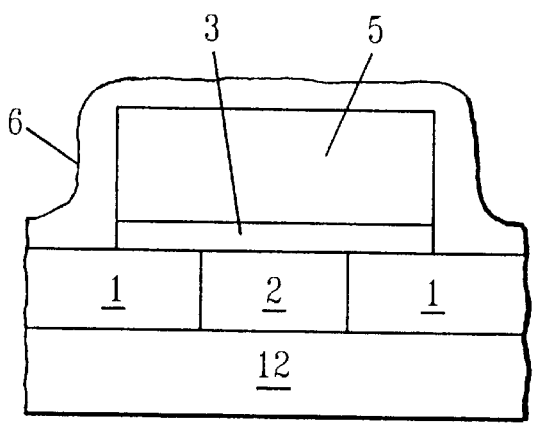
Figure 11D:
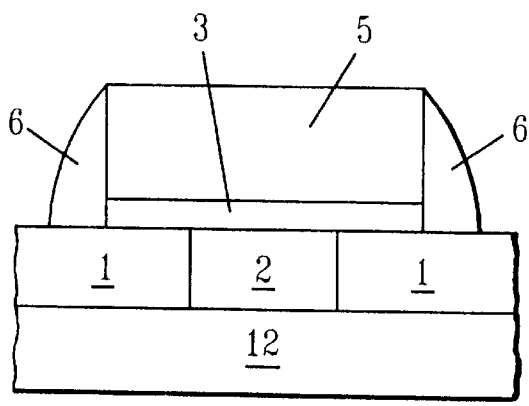

The compound cup electrodes of FIGS. 7–9 can be made by the steps shown in FIGS. 11a–11d. First, blanket layers of horizontal conductive base material 3 and conductive or non-conductive fill material 5 are deposited on a substrate 12 consisting of dielectric 1 and conductive plug 2 (FIG. 11a). Fill material 5 is preferably easy to pattern by reactive ion etching. Layers 3 and 5 are then etched to form the structure of FIG. 11b. A blanket layer of conductive sidewall material 6 is conformally deposited (FIG. 11c) and then anisotropically etched to form sidewall spacers (FIG. 11d). The fill material is then either left as is, forming the filled cup-shaped electrode of FIG. 9, or etched out as desired to form the partially filled cup-shaped electrode of FIG. 8 or the empty cup-shaped electrode of FIG. 7.

Figure 12:
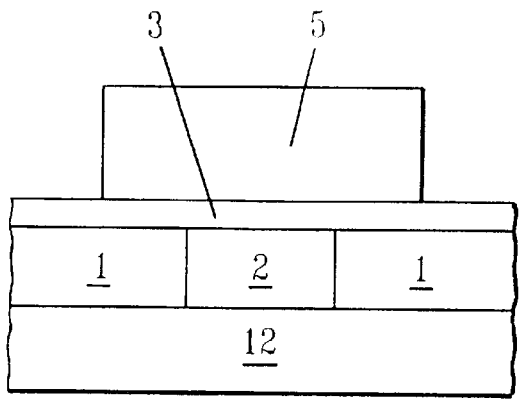
FIGS. 12 and 13 are cross-sectional views of two steps in another method of fabricating the cup electrode of FIGS. 7–9.
Figure 13:
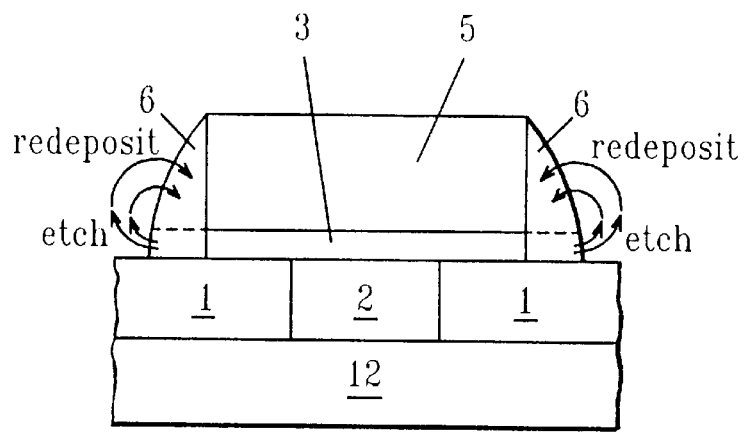

The conductive sides 6 might alternatively be formed by a process sequence incorporating the structure of FIG. 12. Initially, only material 5 is patterned, leaving the blanket film of material 3 (FIG. 12). A blanket sputter etch then removes the exposed portions of layer 3 (as well as a thin layer of material 5); the conductive sides analogous to 6 in FIG. 11d are then formed from sputtered redeposits of material 3 (FIG. 13).

Relative to a single piece cup electrode formed from a single conductive material, the compound cup electrode of the present invention has the base 3 and sidewall spacers 6 deposited in more than one step. However, the base 3 and sidewall spacers 6 need not be formed from the same material (e.g., a diffusion barrier material might be used for the base 3, and a noble metal such as Pt might be used for the conductive sidewall spacers 6). In addition, the compound electrode structure of the present invention is easier to form, since the electrode material is deposited conformally on the outside surface of the electrode infrastructure (e.g., in FIG. 5, electrode material 6 is deposited over the patterned layers 3, 15, and 7), rather than on the more confined inside surface of a sacrificial mold when forming a single layer cup electrode.

Figure 14:
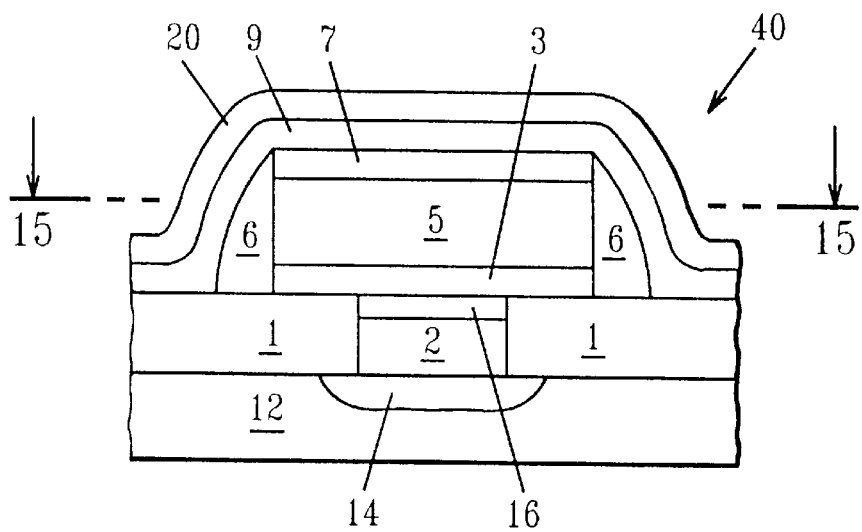
FIG. 14 is a cross-sectional view of one embodiment of an electrical device of the present invention.

The compound electrodes of the present invention are used to form electrical devices such as device 40 (FIG. 14) comprising an insulating or semiconducting substrate 12, a first conductive region 14 formed in said substrate from a first conductive material, a first dielectric layer 1 formed above said substrate, in which the first dielectric layer has a first opening or contact via above some portion of said first conductive region. The first opening is substantially filled with a second conductive material to form a conductive plug 2. A wholly or partially conductive structure 40 (bottom or stack electrode) is directly above and in electrical contact with the top of the conductive plug 2. A layer of capacitor dielectric material 9 of nearly uniform thickness is formed on the exposed surfaces of the stack electrode. A blanket-deposited top or "plate" electrode 20 of a third conductive material is electrically isolated from the stack electrode, but electrically connected to plate electrodes of other devices formed on the same substrate. The stack (bottom) electrode structure is compound; consisting of different materials or materials deposited in separate steps. Examples of the compound electrode include 1) two or more materials incorporated into three or more substantially horizontal layers, 2) a patterned single or multilayer stack, sidewalls of said stack coated with a conductive material, and 3) a conductive base and substantially free-standing conductive sidewalls, the base and sidewalls being arranged in the shape of a cup. In the example of FIG. 14, the electrode 10 consists of a bottom conductive layer 3 and non-conductive layer 5, a top conductive layer 7 and sidewall layer 6.

It should be noted that the portion of the second dielectric material on the horizontal top surface of the compound stack electrode may be omitted in stack electrode structures capped with a dielectric (e.g., the electrode structure of FIG. 1b) without shorting the plate and stack electrodes.

The conductive regions 14 in the layers underlying the stack capacitor of the present invention are formed from the conductive elements of the semiconductor devices in the semiconducting or insulating substrate 12. The first dielectric material 1 is selected from the group consisting of dielectric oxides, nitrides, etc., in particular $SiO_2$, PSG (phosphosilicate glass), BPSG (borophosphosilicate glass), flowable oxide, spin-on-glass, or other conventional dielectric or combination of these. The second conductive material of the conductive plug 2 consists substantially of doped polysilicon, tungsten, or any suitable conductive material. A possible diffusion barrier 16 may be located between the plug and bottom electrode structure 40.

Diffusion barrier 16 is made from a material which may act as a barrier to oxygen diffusion and as a barrier to plug material diffusion. Examples of possible diffusion barrier materials include TiN, $Ta_{1-x}Si_xN_y$ (with 0<x<1 and y<1), and similiar materials. The diffusion barrier materials may or may not be etch-resistant. In another option, the conductive plug is entirely filled with one or more barrier materials.

In the compound stack electrode of the present invention, the conductive electrode materials of layers 3, 6, and 8 are selected from the groups consisting of noble metals (such as Au, Pt, Pd, Ir, Rh), alloys of noble metals with noble or non-noble metals, metals whose oxides are conducting (such as Ru and Mo), electrically conducting oxides (such as $RuO_2$, $IrO_2$, and $Re_2O_3$, etc.), electrically conductive, oxidation-resistant nitrides (such as TaN, TaSiN) and silicides (such as $TaSi_2$), and electrically conducting materials whose oxides may be insulating, such as Ti, Al, TiN, W, WN, doped polysilicon, etc.

The second dielectric material is selected from the group consisting of ferroelectric, paraelectric, perovskites, pyrochlores, relaxors, layered perovskites, or any material with a dielectric constant greater than or equal to 20. Examples of such materials are $Ta_2O_5$, (Ba,Sr)$TiO_3$ (BST or BSTO), $BaTiO_3$, $SrTiO_3$, $PbZr_{1-x}Ti_xO_3$ (PZT), $PbZrO_3$, $Pb_{1-x}La_xTiO_3$ (PLT), $Pb_{1-x}La_x(Zr_yTi_{1-y})_{1-x/4}O_3$ (PLZT), and $SrBi_2Ta_2O_9$ (SBT).

Figure 15A:
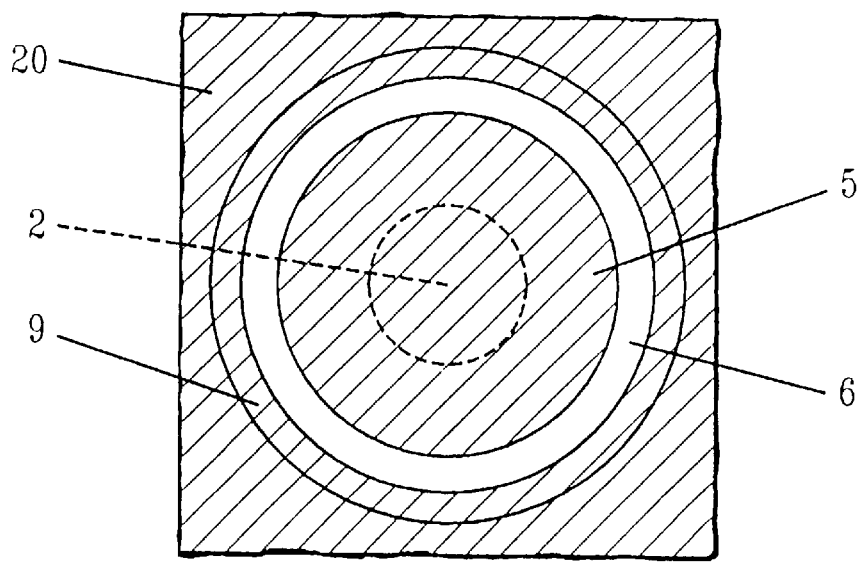
FIGS. 15a and 15b are plan views of two shapes of the stack electrode of the present invention.
Figure 15B:
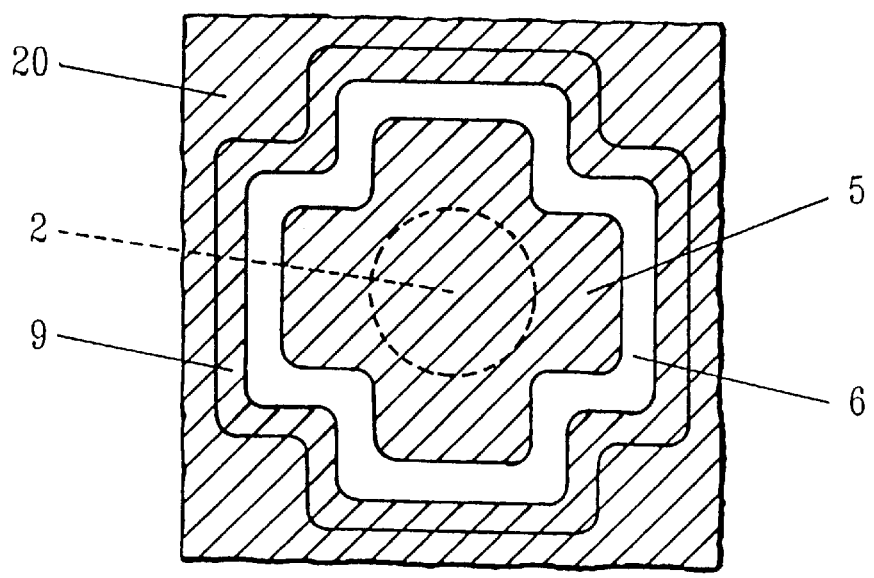

A capacitor having any of the cross-sectional structures described above can be formed where the plan cross-sectional view outline of the stack electrode, taken along lines 15—15 of FIG. 14, can have the form of a filled circle, oval, square, rectangle, cross, etc. as shown, for example, in FIGS. 15a and 15b.

The compound stack electrode structure of the present invention can be used to form memory devices such as a capacitive memory element for DRAM or a ferroelectric memory element for NVRAM or FRAM.

A method to make the self-aligned stack electrode structures of the present invention includes a process in which the layer, from which the conductive sidewall spacers are formed, is deposited after the other compound stack electrode layers. This method has the steps of:

a) filling a via hole embedded in a dielectric with the plug material and the layers of the stack electrode infrastructure, each layer preferably conformally deposited to fill the remaining via volume, polished back by chemical mechanical polishing to make the fill Level with the top of the via hole, and then controllably etched back to leave room in the via hole for the next layer, b) recessing the dielectric to expose the stack electrode infrastructure, c) blanket depositing a thin, conformal layer of conductive material over the recessed dielectric and patterned stack electrode infrastructure, d) anisotropically etching the conformal layer of conductive material to form conductive sidewall spacers, and e) optionally removing any exposed filler material.

A method to make the non-self-aligned compound stack electrode structures of the present invention also includes a process in which the layer, from which the conductive sidewall spacers are formed, is deposited after the other compound stack electrode layers. This method has the key steps of:

a) a blanket deposition of a layered stack that will comprise the horizontal layers of the compound stack electrode, where he bottom layer of the layered stack must be conductive, but the remaining layers of the layered stack may be conductive or nonconductive, b) anisotropically etching (e.g., reactive ion etching or sputter etching) the layered stack to form the nominally vertical-walled "infrastructure" of the compound stack electrode, the infrastructure substantially residing directly above and in electrical contact with the conductive plug, c) blanket deposition of a thin, conformal layer of conductive material over the exposed substrate and patterned stack electrode infrastructure, d) anisotropically etching the conformal layer of conductive material to form conductive sidewall spacers, and e) optionally removing any exposed filler material.

In an alternative method, the compound stack electrode structure is formed by a process in which the layer from which the conductive sidewall spacers are formed is deposited before the other compound stack electrode layers. This method has the key steps of:

a) blanket deposition of the layered stack that will comprise the horizontal layers of the compound stack electrode, where the bottom layer of the layered stack must be conductive, but the remaining layers of the layered stack may be conductive or nonconductive, and where the top layer of the stack is either resistant to the sputter etch conditions that will subsequently be used to pattern the bottom layer of the electrode stack or slightly thicker than the desired final top layer thickness (to compensate for any top layer etching that might occur during bottom layer patterning), b) anisotropically etching all but the bottom layer of the layered stack to form the bulk of the nominally vertical-walled "infrastructure" of the compound stack electrode, the structure substantially residing directly above and in electrical contact with the conductive plug, c) blanket sputter etching for removing the exposed bottom layer of the electrode stack while simultaneously forming conductive sidewall spacers on the sides of the patterned stack electrode infrastructure from redeposits of the sputtered material, and d) optionally removing any exposed filler material.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new and desire to secure by Letters Patent is:

1. A method of fabricating a compound stack electrode structure comprising the steps of:

a) blanket depositing a layered stack onto a substrate comprising a layer of first dielectric material having a conductive plug formed therethrough, said layered stack comprising a plurality of horizontal layers, the bottom layer of said layered stack being conductive, the remaining layers of said layered stack being conductive or nonconductive, b) anisotropically etching all but the bottom layer of said layered stack to form a substantially vertical-walled patterned infrastructure of the compound stack electrode structure, said infrastructure substantially residing directly above and in electrical contact with the conductive plug, and c) blanket sputter etching for removing the exposed bottom layer of the electrode stack while simultaneously forming a conductive sidewall spacer on surrounding sides of said patterned infrastructure from redeposits of the sputtered material.

2. The method of claim 1 further including the steps of:

blanket depositing a layer of a second dielectric material over the electrode structure; and blanket depositing a layer of conductive material on said second dielectric material to form a top electrode.

3. The method of claim 1 further including the steps of:

depositing a layer of a second dielectric material over said conductive sidewall spacer; and depositing a layer of conductive material on said second dielectric material to form a top electrode isolated from said stack electrode.

4. A method of fabricating a self-aligned compound stack electrode structure comprising the steps of:

a) filling a via hole embedded in a dielectric with a plug material and layers of a stack electrode infrastructure, each layer preferably conformally deposited to fill remaining via volume, polished back by chemical mechanical polishing to make a fill level with the top of the via hole, and then controllably etched back to leave room in the via hole for subsequent layer, b) recessing the dielectric to expose the stack electrode infrastructure, c) blanket depositing a thin, conformal layer of conductive material over the recessed dielectric and patterned stack electrode infrastructure, d) anisotropically etching the conformal layer of conductive material to form conductive sidewall spacers, and e) optionally removing any exposed filler material.

5. The method of claim 4 further including the steps of:

blanket depositing a layer of a second dielectric material over the electrode structure; and blanket depositing a layer of conductive material on said second dielectric material to form a top electrode.

6. The method of claim 4 further including the steps of:

depositing a layer of a second dielectric material over said conductive sidewall spacer; and depositing at layer of conductive material on said second dielectric material to form a top electrode isolated from said stack electrode.

* * * * *